United States Patent [19]
Furuhata

[11] Patent Number: 4,825,279
[45] Date of Patent: Apr. 25, 1989

[54] SEMICONDUCTOR DEVICE
[75] Inventor: Shoichi Furuhata, Kawasaki, Japan
[73] Assignee: Fuji Electric Col, Ltd., Japan
[21] Appl. No.: 104,083
[22] Filed: Oct. 5, 1987
[30] Foreign Application Priority Data
  Oct. 8, 1986 [JP] Japan .................. 61-239742
[51] Int. Cl.[4] .............. H01L 23/48; H01L 29/44; H01L 23/16; H01L 29/46
[52] U.S. Cl. ...................... 357/68; 357/71; 357/74; 357/72; 357/75
[58] Field of Search ............ 357/71, 68, 6774, 72, 357/75

[56] References Cited

U.S. PATENT DOCUMENTS 3,886,505  5/1975  Jacobson .................. 357/74
3,893,159  7/1975  Martin .................... 357/75

FOREIGN PATENT DOCUMENTS 0012271  2/1978  Japan .................. 357/71
0135752  8/1984  Japan .................. 357/80
0092646  5/1985  Japan .................. 357/71
0180154  9/1985  Japan .................. 357/71

Primary Examiner—Eugene R. LaRoche
Assistant Examiner—Michael Shingleton
Attorney, Agent, or Firm—Stevens, Davis, Miller & Mosher

[57] ABSTRACT

In a semiconductor device made up of semiconductor elements, a plurality of terminal boards are laid one on another with insulating boards therebetween such that the terminal boards are in parallel with the semiconductor elements and are shifted from one another. The terminal boards are fixedly secured to a substrate through an insulating board, the terminal boards having upwardly extended terminals arranged in parallel and spaced slightly apart fron one another, and lead wires interconnect the electrodes of the semiconductor elements and the exposed surfaces of the terminal boards such that the lead wires extend in a direction perpendicular to the direction of arrangement of the semiconductor elements, whereby substantially equal inductances between the electrodes of the semiconductor elements and the terminals are compensated and are made small.

6 Claims, 1 Drawing Sheet

SEMICONDUCTOR DEVICE

BACKGROUND OF THE INVENTION

This invention relates to a semiconductor device including a plurality of semiconductor pellets with electrodes to each of which common terminal boards are directly or indirectly connected.

One example of a semiconductor device of this type is shown in FIGS. 1A and 1B. Two transistor pellets 1 are secured through a collector terminal board 2 to an insulating board 31. The emitter electrodes and the base electrodes of the transistor pellets 1 are connected through conductors or lead wires 6 to an emitter terminal board 4 and a base terminal board 5 which are fixedly mounted on the insulation board 31, respectively. The collector terminal board 2, the emitter terminal board 4 and the base terminal board 5 have end portions extending vertically as shown in FIG. 1B, namely, an external lead or extended collector terminal 21, an external lead or extended emitter terminal 41 and a base connecting terminal 51, respectively. An auxiliary emitter terminal 42 and an auxiliary base terminal 52 for base drive are fixedly mounted on an insulating board 32, and are connected through conductors in the form of insulated wires to the emitter terminal board 4 and the base connecting terminal 51, respectively. The insulating boards 31 and 32 are fixedly mounted on a common metal substrate 7. A package 8 (indicated by the chain line) covers the common metal substrate 7. The package 8 is filled with resin to isolate the transistor pellets 1 from the external atmosphere.

The semiconductor device thus constructed suffers from the following two difficulties in a high frequency operation because of an inductance $L_s$ between each transistor pellet 1 and a connecting hole 9 formed in each terminal: One of the difficulties is that an excessively large voltage is applied to the transistor pellet because of a surge voltage $V_s = L_x \times I_c/t_f$ which is determined from the inductance $L_s$ and the switching time $t_f$ of a transistor pellet 1 (where $I_c$ is the current flowing in the transistor pellet 1). The other is that, when the transistor pellets are used in parallel, the inductance between one of the transistor pellets and the connecting holes 9 is different from that between the other transistor pellet and the connecting holes 9, as a result of which the turn-on of the one transistor is shifted from that of the other, and therefore a large turn-on loss occurs in the high frequency operation.

SUMMARY OF THE INVENTION

An object of this invention is to eliminate the above-described difficulties accompanying a conventional semiconductor device.

Another object of the invention is to provide a semiconductor device in which the inductances between the electrodes of the semiconductor pellets and the external end portions of the terminal conductors thereof are small so that, in a high speed operation, no excessively large surge voltage is applied to the semiconductor pellets, and the transient currents at the switching are well balanced.

The foregoing objects and other objects of the invention have been achieved by the provision of a semiconductor device having a plurality of semiconductor pellets with electrodes to which common terminal boards are directly or indirectly connected; which, according to the invention, comprises: a plurality of semiconductor pellets arranged in one line; a common substrate; a plurality of terminal boards laid one on another with insulating boards interposed therebetween in such a manner that the surfaces of the terminal boards are in parallel with those of the semiconductor pellets and the terminal boards are shifted from one another, the terminal boards thus laid being fixedly secured to the common substrate through an insulating board; and lead wires connected between the electrodes of the semiconductor pellets and the exposed surfaces of the terminal boards in such a manner that the lead wires extend in a direction perpendicular to the direction of arrangement of the semiconductor pellets, the terminal boards having extended terminal conductors which extend upwardly from one edge of each of the terminal boards and are arranged in parallel and spaced shiftly apart from one another.

In the semiconductor device of the invention, the magnetic fields formed by currents flowing from the electrodes to the terminals are cancelled out, so that the inductances are made small and the above-described object is achieved.

The semiconductor device of the invention may further comprise two auxiliary terminals which are connected through twisted insulated lead wires to the bases of the two corresponding terminal conductors selected from among the terminal boards.

The nature, principle and utility of the invention will become more apparent from the following detailed description when read in conjunction with the accompanying drawings.

DETAILED DESCRIPTION OF THE INVENTION

Figure 1A:
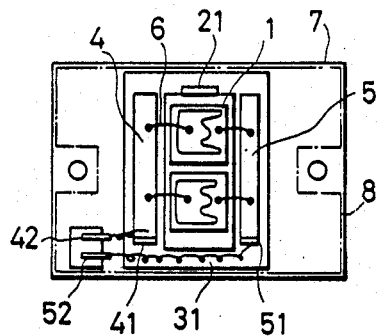
FIG. 1A is a plan view showing a conventional transistor module.
Figure 2A:
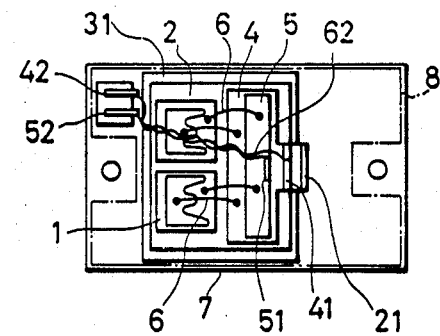
FIG. 2A is a plan view showing a semiconductor device according to the present invention.
Figure 1B:
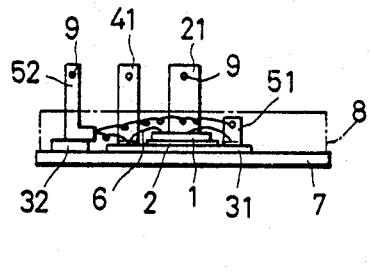
FIG. 1B is a front view of FIG. 1A.
Figure 2B:
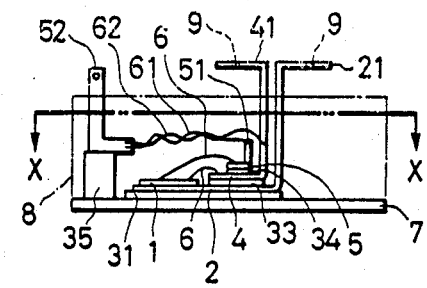
FIG. 2B is a front view of FIG. 2A.

FIGS. 2A and 2B show a semiconductor device according to an embodiment of the present invention. In the drawings, two transistor pellets 1 are mounted on a collector terminal board 2 which is fixedly mounted on a common metal substrate 7 through an insulating board 31 similarly as in the above-described conventional semiconductor device shown in FIGS. 1A and 1B. However, in the semiconductor device of the invention, the collector terminal board 2 is wider, in a directly perpendicular to the direction of arragement of the transistor pellets 1, than that in the conventional semiconductor device, and has an extended collector terminal (extended terminal conductor) 21 extended upwardly from the center of one edge of said terminal board 2. An insulating board 33 is fixedly mounted on the exposed surface of the collector terminal board 2. An emitter terminal board 4 is fixedly mounted on the insulating board 33. The emitter terminal board 4 has an extended emitter terminal (extended terminal conductor) 41 extended upwardly from the center of one edge of said terminal board 4 such a that the emitter terminal 41 is spaced slighly apart from and in parallel with the extended collector terminal 21. A base terminal board 5 is fixedly secured to the emitter terminal board 4 through an insulating board 34. The base terminal board 5 has a base connecting terminal (extended terminal conductor) 51 extended upwardly from its one edge of the base terminal board 5 such that the base connecting terminal 51 is spaced slightly apart from and in parallel with the emitter terminal 41.

The emitter electrodes and the base electrodes of the transistor pellets 1 are connected to the emitter terminal board 5 and the base terminal board 5 through parallel lead wires 6 which extended in a direction perpendicular to the direction of arrangement of the transistor pellets 1, respectively. An auxiliary emitter terminal (auxiliary terminal) 42 and an auxiliary base terminal (auxiliary terminal) 52 are fixedly secured to the substrate 7 through an insulating board 35, and are connected through insulated lead wires 61 and 62 to the emitter terminal 41 and the base connecting terminal 51, respectively. The insulated lead wires 61 and 62 are closely twisted together.

In the semiconductor device thus constructed, a currents flow into the extended collector terminal 21 and the auxiliary base terminal 52 come out from the emitter terminal 41 and the auxiliary emitter terminal 4 via the transistor pellet 1; that is, the current along parallel current paths extended from the transistor, flows in opposite direction as a result, the magnetic fields along the parallel current paths cancel each other out and the inductance between the transistor pellet 1 and the connecting hole 9 of each terminal become small. Particularly, the parallel current paths from the transistor pellet 1 to the connecting hole 9 of the extended collector terminal 21 and that from the transistor pellet 1 to the connecting hole 9 of the extended emitter terminal 41 are substantially equal in length to each other, and therefore the respective inductances are substantially equal with opposite sign. Then, the total inductance of the current paths becomes zero.

In the above-described embodiment, the extended collector terminal 21 and the extended emitter terminal 41 extend upwardly from the middles of the edges of the collector terminal board 2 and the emitter terminal board 4, respectively. However, substantially the same effect can be obtained even if these terminals are extended upwardly from the ends of the edges of the terminal boards.

As described above, in the semiconductor device of the invention, for a plurality of semiconductor pellets, the common terminal boards are laid above one another through the insulating boards, the lead wires connecting the terminal boards and the electrodes of the semiconductor pelllets are arranged in parallel with one another, and the terminal boards have the upwardly extended terminal conductors such that the latter are arranged in a line and extend in parallel with one another with a slight space therebetween. Because of this structure of the semiconductor, the direction of the respective currents flowing between the electrodes and the terminals are opposite each other so that the induced respective magnetic fields cancel each other out. As a result, the inductances are made small, so that no excessively high voltage is applied to the semiconductor pellets at the switching time. Furthermore, as the inductances becomes substantially compensate one another, the shift in turn-on current is reduced, and no turn-on loss is not increased in the high frequency operation of the semiconductor device.

While the invention has been described with reference to the bipolar transistor module, it goes without saying that the technical concept of the invention can be effectively applied to modules made up of field-effect transistors or thyristors.

What is claimed is:

1. A semiconductor device, comprising:
   a common substrate;
   a plurality of insulating boards;
   a plurality of semiconductor pellets arranged in a line, which are provided with a plurality of electrodes to which common terminal boards are connected;
   a plurality of terminal boards superimposed one on another with said insulating boards interposed therebetween and shifted from one another and fixedly secured to said common substrate, the surfaces of said plurality of terminal boards being in parallel with those of said semiconductor pellets;
   lead wires interconnecting said electrodes of said plurality of semiconductor pellets and the exposed surfaces of said plurality of terminal boards, said lead wires extending in a direction perpendicular to the direction of said line along which said semiconductor pellets are arranged; and
   a plurality of extended terminal conductors extending upwardly from one edge of respective ones of said plurality of terminal boards, said extended terminal conductors being arranged in parallel and spaced a small distance apart from one another.

2. A semiconductor device as claimed in claim 1, further comprising:
   two auxiliary terminals; and
   a pair of twisted insulated lead wires through which each of said two auxiliary terminals is connected to a corresponding one of a pair of said plurality of extended terminal conductors respectively.

3. A semiconductor device as claimed in claim 1, further comprising an insulating board through which said plurality of terminal boards are fixedly secured to said common substrate.

4. A semiconductor device as claimed in claim 2, further comprising an insulating board through which said plurality of terminal boards and said two auxiliary terminals are fixedly secured to said common substrate.

5. A semiconductor device as claimed in claim 2, in which said two auxiliary terminals comprise an auxiliary emitter terminal and an auxiliary base terminal.

6. A semiconductor device as claimed in claim 1, in which said plurality of terminal boards comprise a collector terminal board, an emitter terminal board, and a base terminal board, said collector, emitter and base terminal boards being mounted on said common substrate through said insulating boards with said collector terminal board being closest to said common substrate and said emitter terminal board being disposed between said collector and base terminal boards.

* * * * *